(12) United States Patent
Katz et al.

(10) Patent No.: US 7,209,531 B1
(45) Date of Patent: Apr. 24, 2007

(54) APPARATUS AND METHOD FOR DATA DESKEW

(75) Inventors: Daniel A. Katz, Ashland, MA (US); Richard E. Kessler, Shrewsbury, MA (US); Thucydides Xanthopoulos, Charlestown, MA (US)

(73) Assignee: Cavium Networks, Inc., Mountain View, CA (US)

( * ) Notice: Subject to any disclaimer, the term of this patent is extended or adjusted under 35 U.S.C. 154(b) by 846 days.

(21) Appl. No.: 10/397,083

(22) Filed: Mar. 26, 2003

(51) Int. Cl.
*H04L 7/00* (2006.01)

(52) U.S. Cl. ...................... 375/371; 370/517

(58) Field of Classification Search ............... 375/371, 375/373, 355; 370/503, 516, 517, 519; 327/141, 327/161
See application file for complete search history.

(56) References Cited

U.S. PATENT DOCUMENTS 6,166,573 A * 12/2000 Moore et al. ............... 327/161
6,259,330 B1 * 7/2001 Arai ............................ 331/57
6,304,623 B1 * 10/2001 Richards et al. ............ 375/355
6,836,166 B2 * 12/2004 Lin et al. ..................... 327/158
7,031,420 B1 * 4/2006 Jenkins et al. ............. 375/371

OTHER PUBLICATIONS

Implementation Agreement: OIF-SP14-02.0; SPI-4 Phase 2; Title: System Packet Interface Level 4 (SPI-4) Phase 2: OC-192 System Interface for Physical and Link Layer Devices, dated Jan. 2001 (64 pgs).

* cited by examiner

*Primary Examiner*—Khanh Tran
(74) *Attorney, Agent, or Firm*—Blakely, Sokoloff, Taylor & Zafman, LLP (57) ABSTRACT

A deskew circuit utilizing a coarse delay adjustment and fine delay adjustment centers the received data in a proper data window and aligns the data for proper sampling. In one scheme, bit state transitions of a training sequence for SPI-4 protocol is used to adjust delays to align the transition points.

32 Claims, 11 Drawing Sheets

APPARATUS AND METHOD FOR DATA DESKEW

FIELD OF THE INVENTION

The embodiments of the invention relate to data processing and, more specifically, to a technique to deskew received data.

BACKGROUND OF THE RELATED ART

Data transfer between a data transmitter and a data receiver entail problems associated with proper timing of data arrival at the receiver input. In some applications, the received data may be misaligned with the clock signal, so that the data timing is skewed, which may result in incorrect data being sampled by the receiver. The problem may be inherent in the system, such as when trace length on the board are not of uniform length for the input lines and the clock signal. In other instances, the skew between the data and clock timing may be designed into a specification as a permitted tolerance, so that the designer may need to adjust for the skew at the receiver end.

The System Packet Interface Level 4 (SPI-4) protocol specification allows for some skew between the various data and clock pairs. Although this loose tolerance reduces the system complexity, each SPI-4 receiver is required to implement some deskew logic to recover the timing. A variety of deskew techniques may be implemented and some implementations achieve the deskew by some sort of averaging algorithm at the pad level.

The described embodiments of the invention address the deskew of SPI-4 interface, as well as other data transfer interfaces.

SUMMARY OF THE EMBODIMENTS OF THE INVENTION

A deskew circuit utilizing a coarse delay adjustment and fine delay adjustment to align bit placement for sampling is described. A coarse delay unit receives a bit pattern, which may be skewed in timing with a corresponding reference clocking signal, and aligns sampling of bits of the bit pattern to within a same selected bit-time frame. In one embodiment, the selected bit-frame is the bit-frame of the latest occurring bit.

A fine delay unit receives the bit pattern and aligns sampling of bits of the bit pattern away from an edge or edges of the selected bit-time frame. In one embodiment, the alignment is achieved by incrementing or decrementing offset delay values until an edge is found and then moving the bit position away from the edge. The sequence of applying delay offsets eventually repositions the bit toward the center of the bit-time frame.

Thus, coarse delay adjustment is used to align the appropriate bits into one bit-time frame and fine delay adjustment is used to position the bits toward the center of the bit-time frame. In order to perform the alignment procedure to set the circuitry for properly aligned data transfer, one embodiment uses a bit state transition of a training sequence for SPI-4 protocol as a reference to align the transition points. The deskew operation results in the centering of the received data in the proper data window and alignment of data for proper sampling.

BRIEF DESCRIPTION OF THE DRAWINGS

Embodiments of the present invention are illustrated by way of example and not for the purpose of limitation. In the Figures of the accompanying drawings, similar references are utilized to indicate similar elements.

DETAILED DESCRIPTION OF THE INVENTION

An apparatus and method to deskew signals received from a signal source is described. In the following detailed description, numerous specific details pertaining to deskew are set forth. However, it is to be noted that the various specific examples detailed may not be necessary in some instances to practice the embodiments of the present invention. Furthermore, the embodiments of the invention are described in a particular setting in which data is sent by a transmitting unit and received by a receiving unit that implements a particular deskew scheme. The described data transfer protocol is System Packet Interface Level 4 (SPI-4) or OC-192 System Interface for physical and link layer devices. The SPI-4 interface is used as an example to describe one embodiment for implementing the invention. However, it is to be noted that other deskew techniques may be readily implemented in other settings and interfaces as different embodiments of the invention. Thus, the invention is not limited to SPI-4 protocol.

Figure 1:
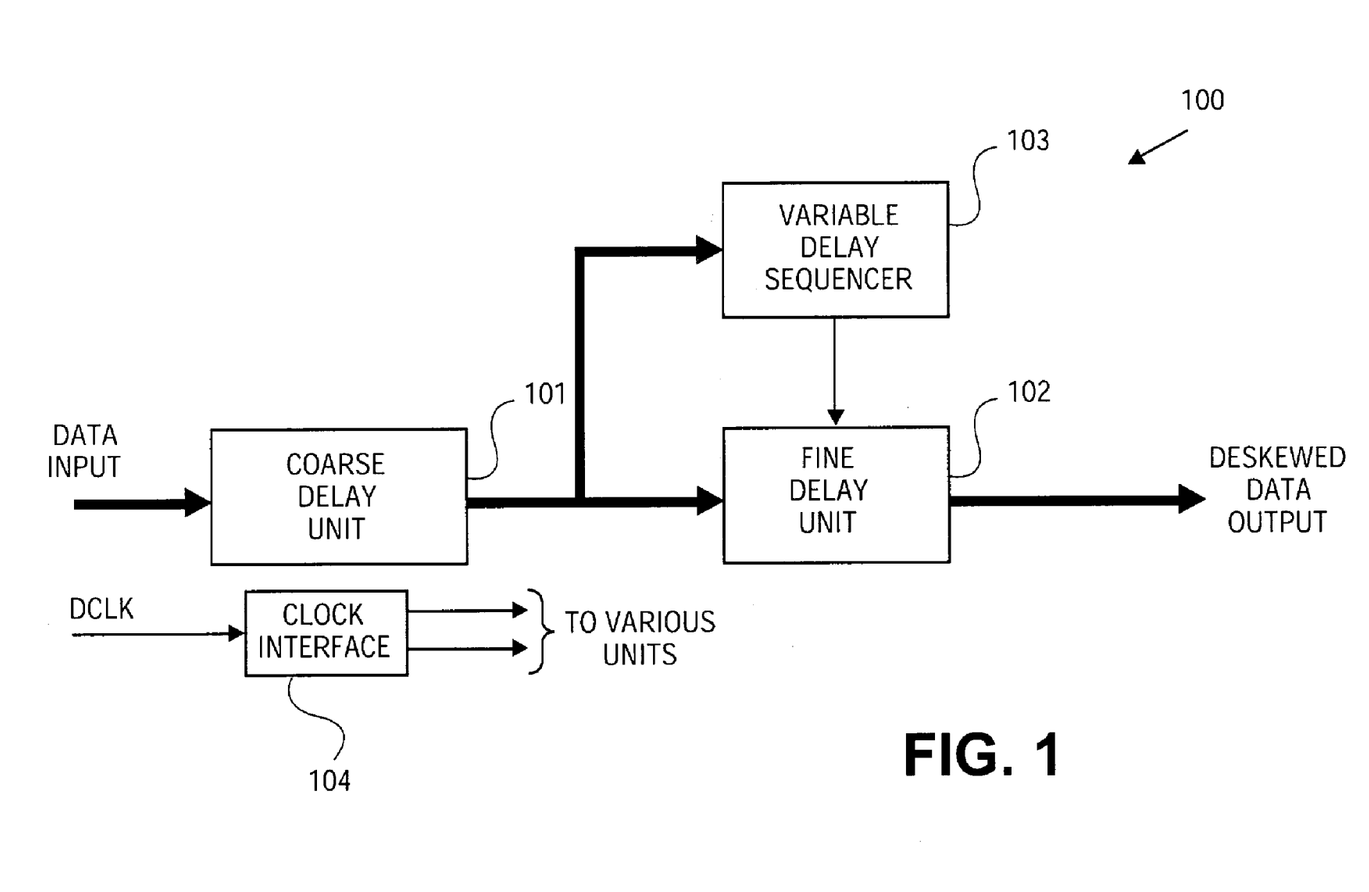
FIG. 1 shows a circuit block diagram of an embodiment of a deskew unit of the present invention, in which a coarse delay unit and a fine delay unit are utilized to deskew received data.

Referring to FIG. 1, a deskew circuit 100 is shown. Deskew circuit 100 is just one embodiment for practicing the present invention. As noted above, a variety of other embodiments may be readily implemented as well to practice the invention. Deskew circuit 100 comprises a coarse delay unit 101, fine delay unit 102, variable delay sequencer 103 and associated bus(es) to couple the various units. Deskew circuit 100 may include a clock interface unit 104 to receive a reference clock signal from the data transmitting unit and generate one or more timing signals to clock the units of circuit 100. The example deskew circuit 100 receives data input and a data clock (DCLK) from a data transmitting unit. As noted above, SPI-4 may be used to interface deskew circuit 100 to a data transmitting unit, in which case the data transfer is accomplished in data packet format.

Deskew circuit 100 performs a deskew operation on the incoming data so that corresponding data bits are aligned to the timing of the received data clock signal DCLK. As noted in the Background section above, although data bits may be transmitted having the proper timing, the received data bits may not retain the proper timing by the time the bits arrive at the receiving unit. With some interface protocols, such as SPI-4, the specification may permit incoming bits to be off by a clock period. Emphasis is then placed on a deskew operation to recover the bit timing to correctly sample the received data. Accordingly, deskew circuit 100 aligns the appropriate bits of a pattern to have proper timing with each other and the clock signal, so that the data bits received may be output having the same timing relationship corresponding to the transmitted bits.

The example circuit, shown as deskew circuit 100, utilizes coarse adjustment and fine adjustment to perform the deskew operation. Although the order of performing the coarse delay adjustment and fine delay adjustment may differ in other embodiments (and some embodiments may perform the two operations in parallel), the particular operative order of deskew circuit 100 is shown having the coarse delay adjustment first, followed by the fine delay adjustment, to conform to the order of the description below. Coarse delay unit 101 is utilized to provide the coarse adjustment and fine delay unit 102 is utilized to provide the fine adjustment to recover the proper timing of the incoming data bits. Circuit representation may be shown differently, as will be noted in FIG. 4.

Figure 2:
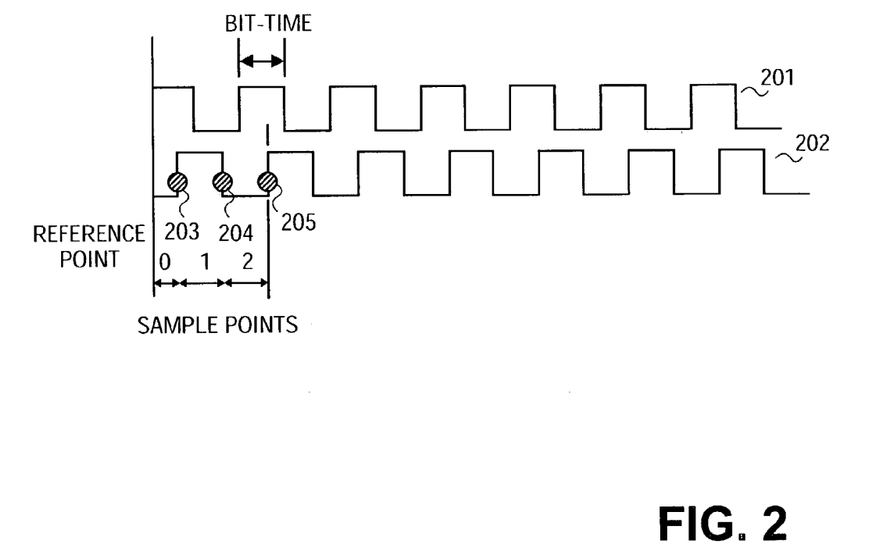
FIG. 2 shows a waveform diagram in which data samples are aligned into a latest bit-time frame using a coarse delay adjustment scheme.

Although a variety of coarse adjustments may be applied, the described embodiment utilizes a technique illustrated in FIG. 2. FIG. 2 shows a bit-time waveform 201 in which two bit-times are noted for a given waveform cycle. Since data-phase transfer is performed twice a cycle, data transition occurs at the leading edge and at the trailing edge of the waveform 201. Thus, new data may be present and sampled during each bit-time frame (each half-cycle). A sampling waveform 202, which is slightly out of phase to waveform 201, samples the received data at its edge transitions. The phasing of the sampling waveform 202 ensures that the bit to be sampled is near the middle of the bit-time frame, so that the data is stable at the time of the sampling, presuming the data is aligned properly.

Because signals may be skewed, the received bits of a bit pattern may not have proper timing relative to the other bits of the pattern and/or the reference clock signal, when received. Waveform 202 shows a situation where the bit may be off by a full cycle, which is actually two bit-time frames. Thus, a given bit that should be sampled in a bit-time frame, may actually arrive during a different bit-time frame relative to other bits of the bit pattern. Thus, as illustrated in FIG. 2, bit(s) of a pattern may be misaligned (skewed) since bits may arrive and be sampled at sample points 203, 204 or 205, depending on the skew for that bit. If all of the bits are skewed the same amount, then deskew is not an issue as to bit-time framing alignment. However, if at least one bit is out of alignment, then the bit alignment is incorrect. The coarse deskew technique of the described embodiment ensures that the bits are aligned to the same select bit-time frame. In the embodiment described below, the latest occurring bit-time for a given set of transmitted bits of a pattern is used to select that bit's bit-time frame for aligning the bits. Thus, bits of a bit pattern are aligned to the bit-time frame of the latest occurring (or arriving) bit.

For example, if bits of a given word (here, "word" is used as an example of a bit pattern) are sampled at different times due to skew and the latest sampled bit occurs at sample position 205, then those bit(s) of the word occurring at position 204 are delayed one bit-time and those bit(s) of the word occurring at position 203 are delayed two bit-times, so that all bits of the word are in alignment in bit-time frame corresponding to position 205. Thus, coarse delay unit 101 introduces appropriate bit time delay(s) to align the bits to be sampled within the same selected bit-time frame. In the example, the bit-time frame of the latest bit is selected.

Figure 3:
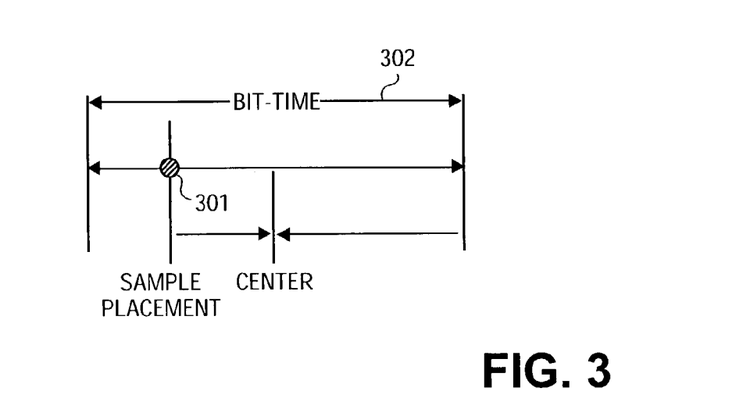
FIG. 3 shows a waveform diagram in which a bit sample placement is moved towards a center portion of the bit-time frame using a fine delay adjustment scheme.

A fine delay adjustment is employed to position the sampling point to within a middle region of a bit-time frame. FIG. 3 shows an example of a sample bit placement, where the bit position is nearer the trailing edge (left side) of the bit-time frame 302. A bit placement point is used here to indicate a point (or a center of a window of very short duration) where the particular bit value is valid. It is understood that the bit placement point exemplifies a desired point where the bit sampling is to occur. In the example, it is ideal to have the bit placement near the center of the bit-time frame 302. Otherwise erroneous reading may occur at the desired sampling point, which is near the center of the bit-time frame 302. In order to achieve center placement of the bit for sampling, the fine delay unit 102 is used to adjust finer incremental delay to move the bit within the particular bit-time frame. By providing this fine adjustment within bit-time frame 302, a bit skewed toward an edge of the bit-time frame, may be repositioned toward the center of the bit-frame. In the example of FIG. 3, delay is incremented until bit placement 301 is moved right toward the center of the frame 302. If the bit position was near the leading edge (right side) of the bit-time frame 302, delay would have been reduced to move the bit placement left toward the center.

In one embodiment, fine delay unit 102 sets a middle delay value to reside at a center portion of the bit-time frame, so that incremental delay offsets may be added or subtracted by predefined graduations (referred to as increments or offsets). In this manner, a bit skewed toward the trailing edge (left edge), may have the bit delay incremented, so that the bit placement moves away from the trailing edge toward the center. Likewise, a bit skewed toward the leading edge (right edge) may have the bit delay decreased, so that the bit placement moves away from the leading edge toward the center. The amount of the delay offset and direction to determine the desired location of the bit placement are controlled by variable delay sequencer 103.

Therefore, the coarse delay adjustment aligns the corresponding bits into one bit-time frame and the fine delay adjustment aligns each individual bit within the bit-time frame. As noted previously, the order may be reversed or both done in parallel. Since the fine delay adjustment is employed separately to each bit and the adjustment is made within the bit's bit-time frame, not all of the bits need be in the same bit-time frame for the fine delay adjust to be performed. Bits may be individually aligned within the corresponding bit-frames first and then moved into a selected bit-frame. Thus, individual bit alignment operation provided by the variable delay sequencer 103 and fine delay unit 102 attempts to center the bits within a given bit-time frame and the coarse delay unit 101 places the bits into one bit-time frame to perform the deskew operation.

The clock interface circuit 104 receives a timing signal and generates internal clocking signals to perform the coarse and fine delay adjustments. Furthermore, the example above denotes the bits comprising a word, but the bits may represent other data formats or the bits may represent other than data. Additionally, a variety of known test signals may be sent to perform the deskew operation, signals which will ensure detection of a test or reference pattern. As will be described below in reference to a specific embodiment, one form of reference signal is the training sequence specified in SPI-4 interface. The SPI-4 training sequence comprises one idle control word followed by one or more repetition(s) of a 20-word training pattern of ten repeated training control words and ten repeated training data words. When the control word and data word have opposite bit states, then a bit transition occurs for each bit after the tenth word of the training sequence. The bit transitions at the middle of the two fixed patterns are then utilized to determine the proper alignment to deskew the bits. That is, a training sequence state change is used to detect bit transitions and to insert proper bit delays in each bit path, so that all of the bit lines are aligned (deskwed) for proper sampling of data (or other signals). The training sequence pattern utilized with the SPI-4 interface, is described below.

Figure 4:
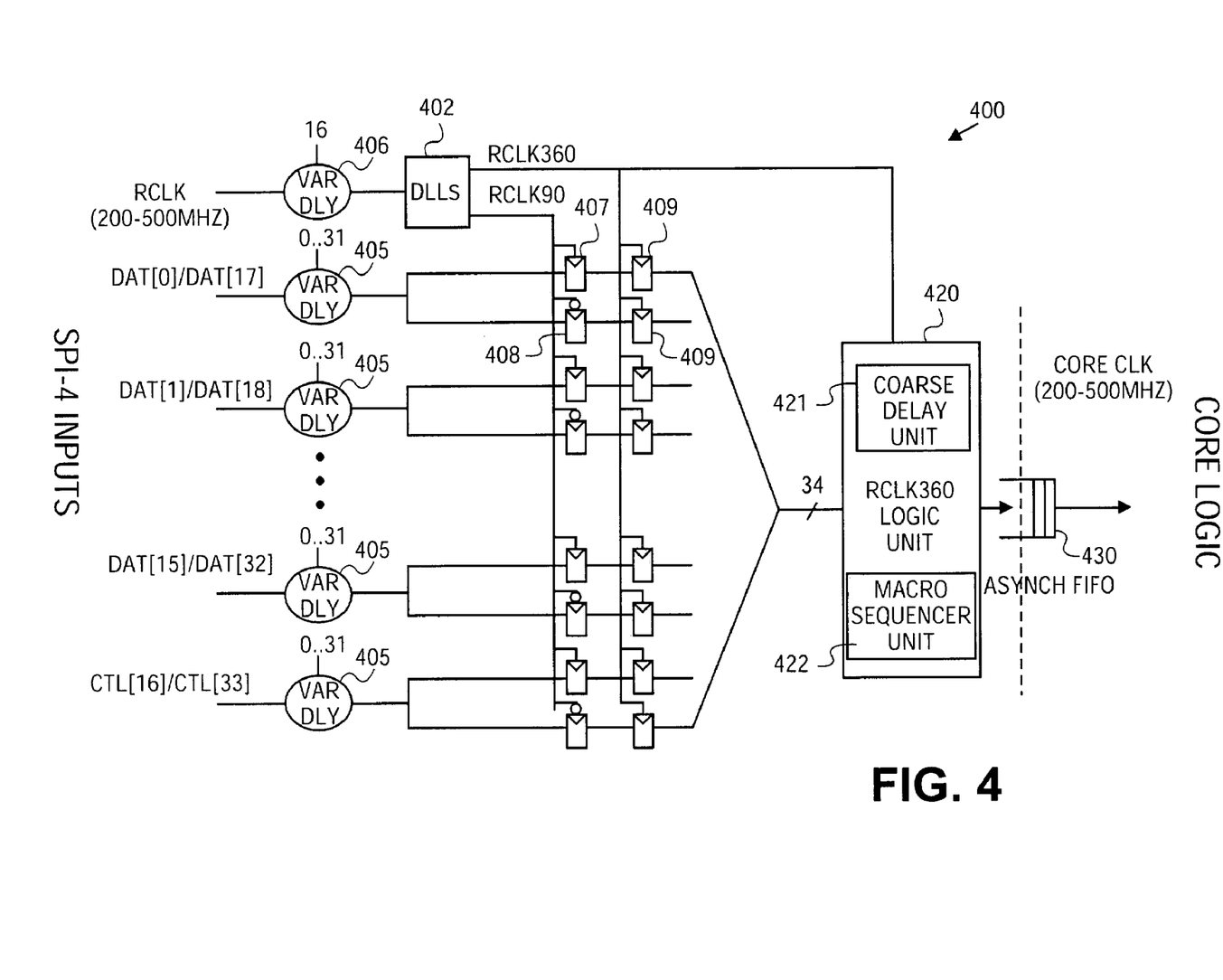
FIG. 4 shows a circuit schematic diagram of an embodiment of a deskew circuit utilized to deskew input data.

Referring to FIG. 4, a deskew circuit 400 is shown in which circuit 400 is designed for use with the SPI-4 protocol specification. Accordingly, deskew circuit 400 is implemented in a SPI-4 receiver to receive signals in packet format. Circuit 400 is a specific implementation of the deskew circuit shown in FIG. 1. The input comprises thirty-two data bits and two control bits, plus a clocking signal RCLK. The 34-bit input occurs during a full clock cycle. However, the data and control bits are separated into two data-phases (half-cycle), so that sixteen bits of data DAT[0] DAT[15] and control bit CTL[16] are received during one bit-time frame and the other sixteen bits of data DAT[17]–DAT[32] and control bit CTL[33] are received on the same input lines during the second bit-time frame of one RCLK cycle. The thirty-four bits are noted as bits [0]–[33].

The seventeen bit lines are coupled through respective variable delay elements 405. In the particular example, RCLK is also coupled through a separate delay element 406 to introduce a nominal delay, although such delay element 406 may not be used in other circuit implementations. Delay elements 405, when combined, are equivalent to the fine delay unit 102 of FIG. 1. Delay elements 405 introduce individual delay to corresponding input bits [0]–[33] to introduce fine delay adjustment of the input bits. Each of the seventeen bit lines is then coupled to a corresponding pair of positive triggered and negative triggered latches 407 and 408 to separate the [0]–[16] bits from the [17]–[33] bits. In the example, the delay elements 405 are variable, as noted by delay positions 0–31. Delay element 406 may be variable, but in the example is fixed at position 16 (middle position), since this position corresponds to the approximate middle of the delay line described below.

Figure 5:
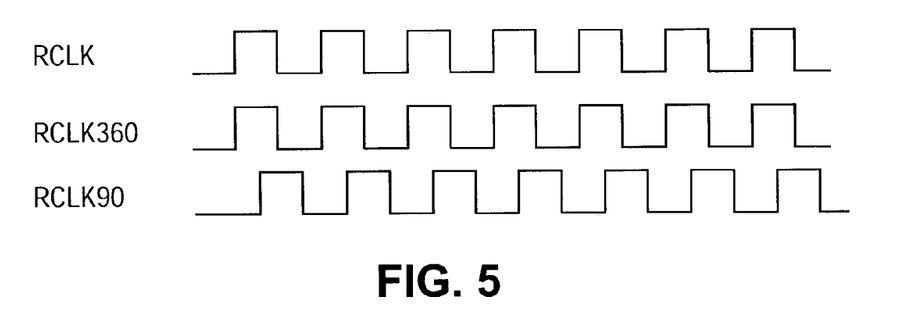
FIG. 5 shows waveforms of clocking signals pertaining to the deskew circuit of FIG. 4.

The RCLK input is coupled to a delay lock loop (DLL) 402, which generates the internal clocking signals RCLK360 and RCLK90. DLL 402 operates equivalently to the clock interface 104 of FIG. 1. The timing relationship of the three clock signals is shown in FIG. 5. The SPI-4 RCLK waveform is the timing signal generated by the transmitter sending the bits [0]–[33]. The DLL generated RCLK360 is an in-phase clock signal mirroring RCLK. The RCLK90 is the RCLK360 signal phase shifted 90 degrees. Since the RCLK360 signal is in-phase with the RCLK signal, RCLK360 signal is used to determine the correct bit timing. However, in order to ensure that bit values are stable prior to sampling, the RCLK90 is used to delay the bit sampling by 90 degrees. Although a 90 degree phase delay is employed in the example, other phase relationships may be readily used as well. As noted in FIG. 6, the 90 degree shift allows sampling to occur in the middle of the bit-time frame determined by the RCLK/RCLK360 signals.

Accordingly, the RCLK90 signal is coupled to trigger the latches 407 and 408. Latches 407 trigger the bits during positive-going edge of the RCLK90 signal and latches 408 trigger the bits during the negative-going edge of the RCLK90 signal. Thus, one set of latches 407 samples the bits present on the input lines during one bit-time frame of a clock cycle, while the other set of latches 408 samples the next set of bits during the other bit-time frame of the clock cycle. The output of the latches 407/408 are then coupled through individual latches 409, which are all triggered by RCLK360. Accordingly, all thirty-four bits are output from latches 409 in parallel each clock cycle. Again, the 90 degree phase shift of RCLK90 ensures that stable bit values are present for latching out of latches 409.

As shown in FIG. 4, the bits [0]–[33] are coupled to a RCLK360 logic unit 420. The logic unit 420 also includes a coarse delay unit 421 and a macro sequencer unit 422. Coarse delay unit 421 is equivalent to coarse delay unit 101 of FIG. 1 and macro sequencer unit 422 is equivalent to the variable delay sequencer 103 of FIG. 1. The operations of these units 421, 422 are described below in more detail. The output of the logic unit 420 is a deskewed bit pattern, which is stored in an buffer, which in this case is an asynchronous first-in first-out (FIFO) unit 430. The output from the FIFO 430 may then be coupled to a core logic of a processor to process the bits. In the particular example shown in FIG. 4, the RCLK clock rate and the core clock rate is established in the approximate range of 200–500 MHz. Since two sets of data are transferred each clock cycle, data transfer rate is double the clock rate (400 MHz–1 GHz). It is appreciated that these data rates are presented as an example only and that other data rates may be employed. Furthermore, it is to be noted that although a single bit line is shown, in actual implementation, the bit lines may be differential.

As noted in reference to SPI-4 protocol, the specification establishes a training sequence of ten repeated bit pattern followed by another ten repeated bit pattern. With the training sequence sending a pattern of ten 10FFF$_{16}$ followed by a pattern of ten 0F000$_{16}$, all bits will change states at the transition point of 10FFF-0F000. This transition point in the training sequence is utilized by the deskew circuit 400 to detect and apply the correct coarse and fine delays to the bit lines to align the transition points. When the receiver is first initialized, it begins watching for the training sequences on the SPI-4 input bus as the SPI-4 protocol dictates and notes when the bit transitions occur during the training sequence. For a properly deskewed circuit, all bit transitions will occur at about the same time. A skewed condition is noted when bits transition at different times.

Figure 6:
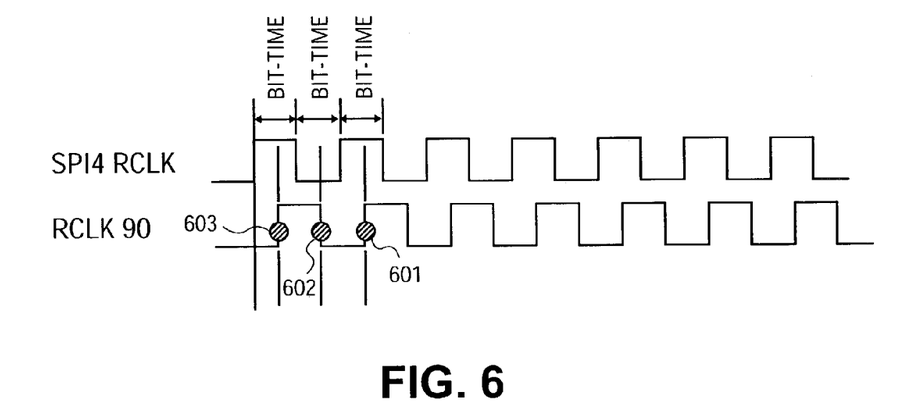
FIG. 6 shows a waveform diagram to perform coarse delay adjust in the deskew circuit of FIG. 4 to align bit placement to a latest occurring bit-time frame.

The coarse delay adjustment is employed by the coarse delay unit 421 to introduce coarse delay. As illustrated in FIG. 6, RCLK90 sampling places a bit transition point of the training sequence at one of three bit-time frames of RCLK (and RCLK360). If not all transitions occur in the same bit-time frame, coarse skew is present. The coarse delay unit waits until all bits transition and the last bit to transition is set to "choose the latest value." This is shown as bit position 601 in FIG. 6. Bit(s) transitioning one bit-time frame earlier (position 602) is/are set to have a delay of one bit-time frame to coincide with the bit-time of the latest value (position 601). Bit(s) transitioning two bit-time frames earlier (position 603) is/are set to have a delay of two bit-time frames to coincide with the bit-time of the latest value (position 601). Thus, coarse delay introduces delay of two bit-times, one-bit time or no delay to place the sampling of the bit transitions into the same bit-time frame. As will be noted in the example circuits of FIGS. 7 and 8, once the transitions are noted for each bit line, the bit chosen (depending on the occurrence of the transition) will be the latest bit, a bit from the previous bit pattern (17-bits ago) or a bit from two patterns ago (34-bits ago).

Figure 7:
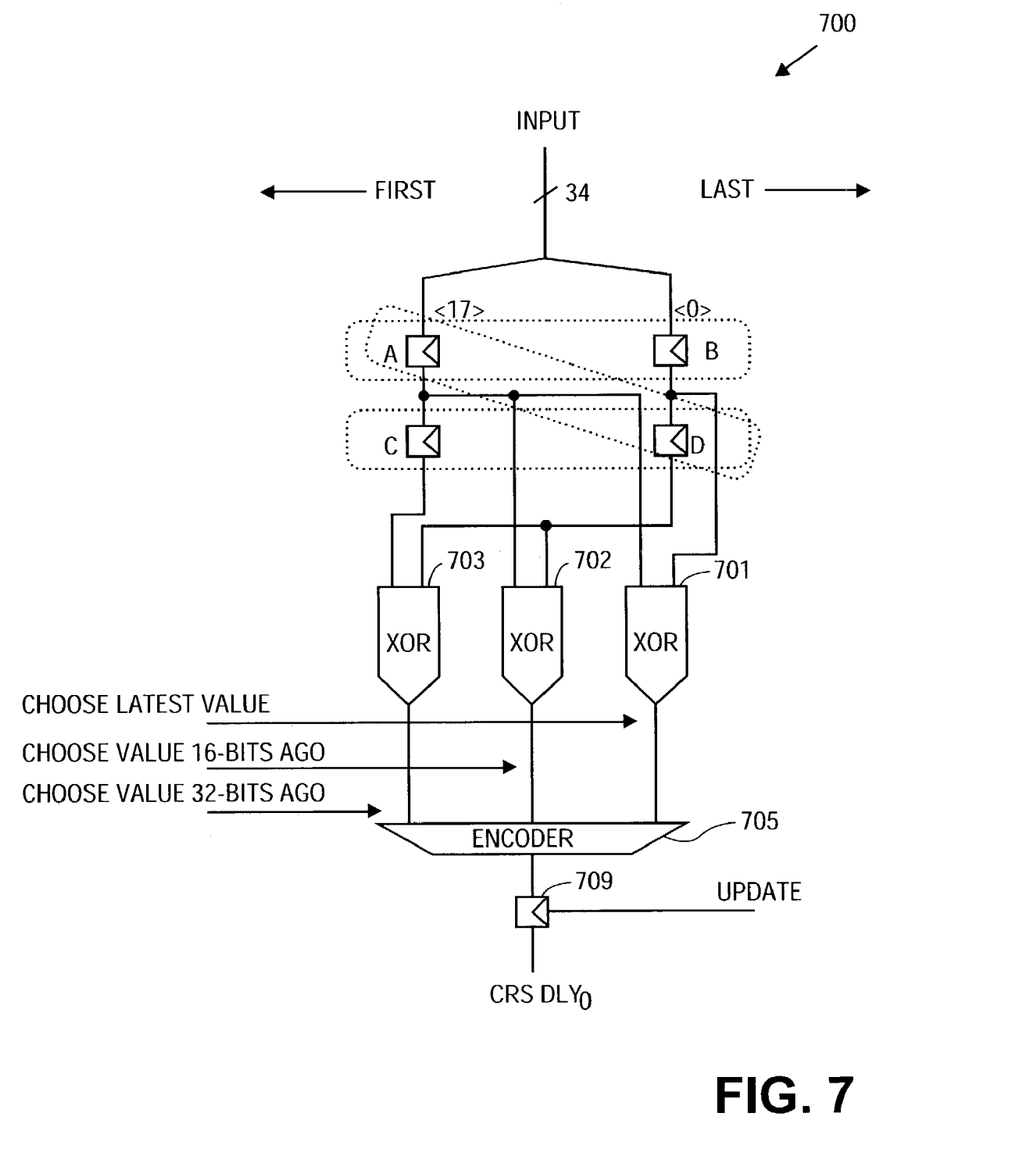
FIG. 7 shows a circuit schematic diagram to generate a select signal to select proper bit delay for the coarse delay unit of the deskew circuit of FIG. 4.
Figure 8:
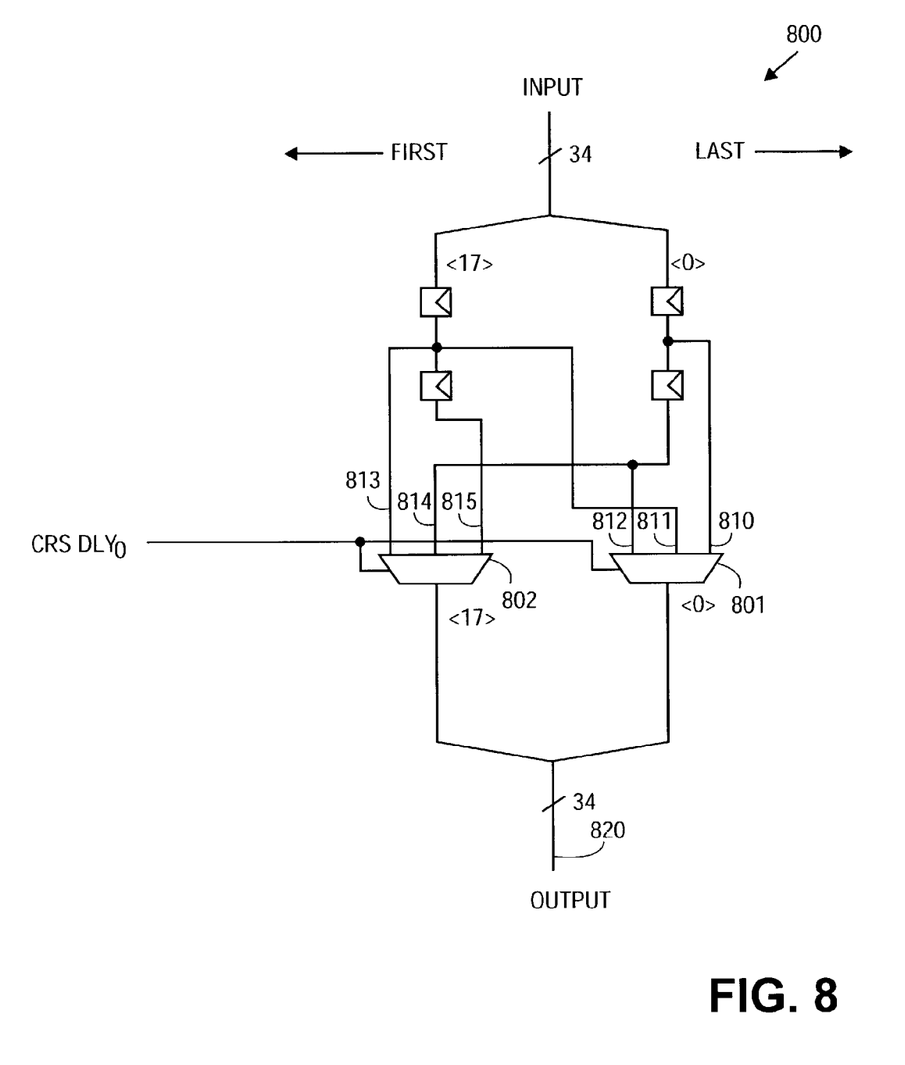
FIG. 8 shows a circuit schematic diagram to obtain the proper coarse delay for the coarse delay unit of FIG. 4 and to detect (or not-detect) the edge when testing for fine delay.

One example embodiment to achieve the coarse adjustment is illustrated by the circuits shown in FIGS. 7 and 8. FIG. 7 shows a coarse delay select circuit 700 to generate a coarse delay select signal, which will be utilized by a coarse delay circuit 800 of FIG. 8. Circuit 700 is shown for bits [0] and [17] only. It is to be noted that the other corresponding bit pairs (e.g., bits [1] and [18], etc) will also have similar circuit 700. Initially all delay values are set to zero ("choose latest bit"). A state machine watches for the initial 10FFF to 0F000 transition and asserts an update signal to select the coarse delay. The coarse delay is determined from the flip-flop pair that contains the 0 to 1 or 1 to 0 transition.

In circuit 700, bit [0] transitions through flip-flops B and D, while bit [17] transitions through flip-flops A and C. The timing of the flip-flops follows the bit-time frame timing earlier described, so that flip-flops B and D latches with the bit[0] timing and flip-flops A and C latches with bit [17]. Bits are first latched through A then C and similarly B then D. Three exclusive-OR (XOR) logic gates 701, 702, 703 determine which timing pair detects the bit-state transition between bit [0] and bit [17]. When flip-flop pair AB has the bit-state transition, then XOR gate 701 generates an indication to an encoder 705 that the transition is at the latest bit-time. When flip-flop pair DA has the bit-state transition, XOR gate 702 detects the state change as occurring 17-bits ago (previous bit-time frame). When flip-flop pair CD has the bit-state transition, XOR gate 703 detects the state change as occurring 34-bits ago (two bit-time frames). The encoder 705 encodes the output of the appropriate XOR gate 701–703 and latches the indication to the coarse delay circuit 800 when the UPDATE signal triggers latch 709. As noted, the select signal CRS $DLY_0$ applies to the bits [0] and [17] line. Similar circuitry is utilized for the other bit pair positions.

Circuit 800 of FIG. 8 also shows one circuit for the bit pairs [0] and [17]. Similar circuitry are used for the other bit pairs as well. The CRS $DLY_0$ signal selects the output for bit [0] multiplexer (mux) 801 and bit [17] mux 802. Since the flip-flop pair arrangement of circuit 800 is similar to the flip-flop arrangement of circuit 700, mux 801 selects the latest bit value on line 810, value from 17-bits ago (which would be bit [17]) on line 811 or value from 34-bits ago (bit [0] of previous cycle) on line 812. Likewise for bit [17], mux 802 selects the latest bit value on line 813, value from 17-bits ago (which would be bit [0]) on line 814 or value from 34-bits ago (bit [17] of previous cycle) on line 815. The flip-flops of FIG. 8 operate equivalently as the flip-flops of FIG. 7 to provide the AB, DA and CD timing arrangement for determining the transitions. Furthermore, the circuit of FIG. 8 is also used to detect (or not detect) the edge when testing for fine delay adjustment, as described below.

By utilizing the example circuits 700 and 800, each bit pair transition may be monitored and correct timing established so that all transitions on the output line 820 occur within the same bit-time frame of RCLK360. That is, bit transitions are aligned to the bit-time of the latest bit transition to perform the coarse delay operation. Once the coarse delay adjustment is made, CRS DLY0 maintains its value, so that circuit 800 delay path is set to generate an aligned output 820, until the next coarse adjustment is made.

Figure 9A:
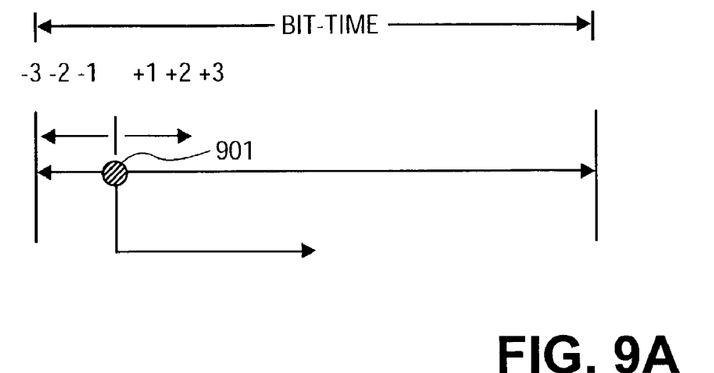
FIGS. 9A, 9B and 9C show waveform diagrams exemplifying one technique to perform fine delay adjust in the deskew circuit of FIG. 4 to align bit sampling to occur away from the edges of the bit-time frame.
Figure 9B:
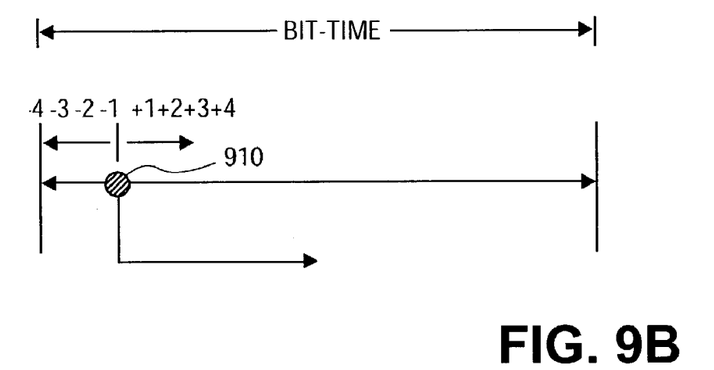
Figure 9C:
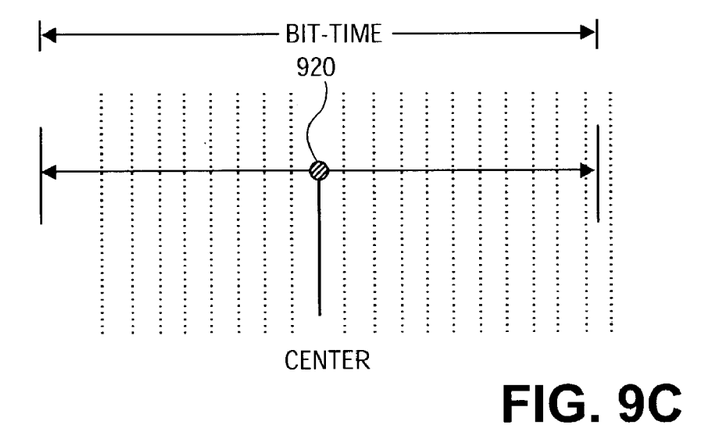

FIGS. 9A–C illustrate how the variable fine delay is implemented to adjust each bit position to a more central location in a given bit-time frame. The illustrations show placement and adjustment of a sample point for a single bit line. It is to be noted that each bit line is individually adjusted. Assume that a given bit position within a bit-time frame is at position 901. The bit position is closer to the left edge of the bit-time frame. The left and right lines designate the edge transitions of the bit-time of RCLK. The bit position indicates a sample point for the bit. Since bit position 901 may reside anywhere within the bit-time frame, one way to detect it's actual position is to locate one or both edges. Hence, a sequence of delay values (offsets) are incremented/decremented to the starting location to move the bit position 901 first in one direction then in the opposite direction.

As shown in FIG. 9A, a +1 delay increment moves the position one offset value to the right. If an edge transition is not detected, then a −1 delay decrement is performed to move the position one offset to the left. If an edge is not detected, then +2 increment is made from the original position 901. The + and − values are increased alternately until an edge is detected. In FIG. 9A, an edge (left edge of the bit-time frame) is detected when −3 value is used.

Once an edge is detected, the position placement of the bit is moved one offset value in the opposite direction. In this example of position 901, the left edge of the bit-time is detected when a value of −3 is tried. The bit placement is then moved one position value to the right (+1 value) toward the center of the bit-time frame. Then the sequence is repeated from the new position 910, which is shown in FIG. 9B. Next the sequence of +1, −1, +2, −2 etc. is repeated until the edge is found. In this instance, the left edge is located at −4. The bit placement is moved another value to the right (+1) and the sequence repeated. Eventually, a position 920, shown in FIG. 9C, is reached which is at or near the center of the bit-time frame. The center, or a location near center, may be identified when both the right and left edges are detected, or alternatively, some maximum offset value is reached. For example, the position sequence had reached a maximum set value of +16 or −16.

Figure 10:
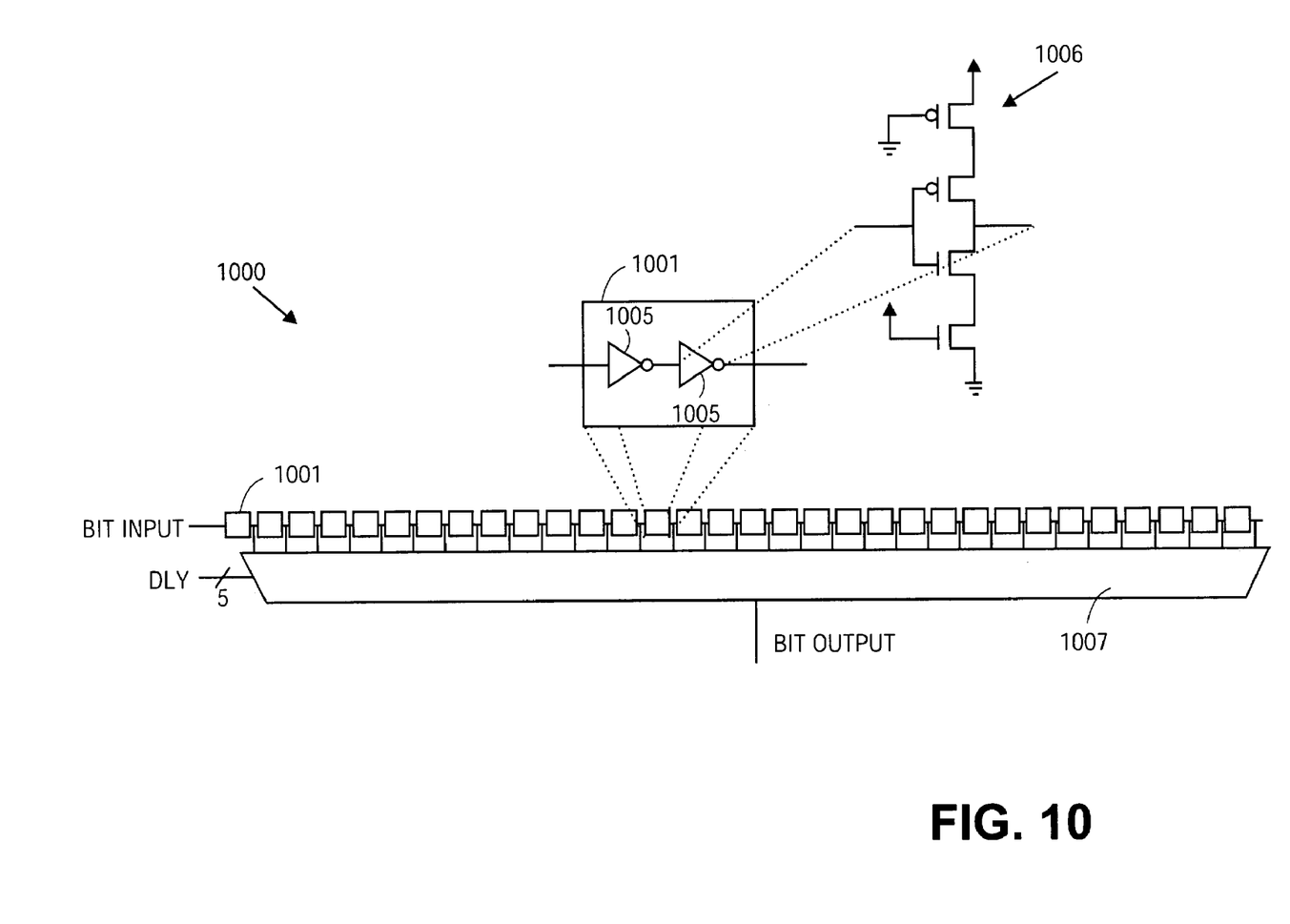
FIG. 10 shows a circuit diagram of an in-line delay line to adjust fine delays in the deskew circuit of FIG. 4.
Figure 11:
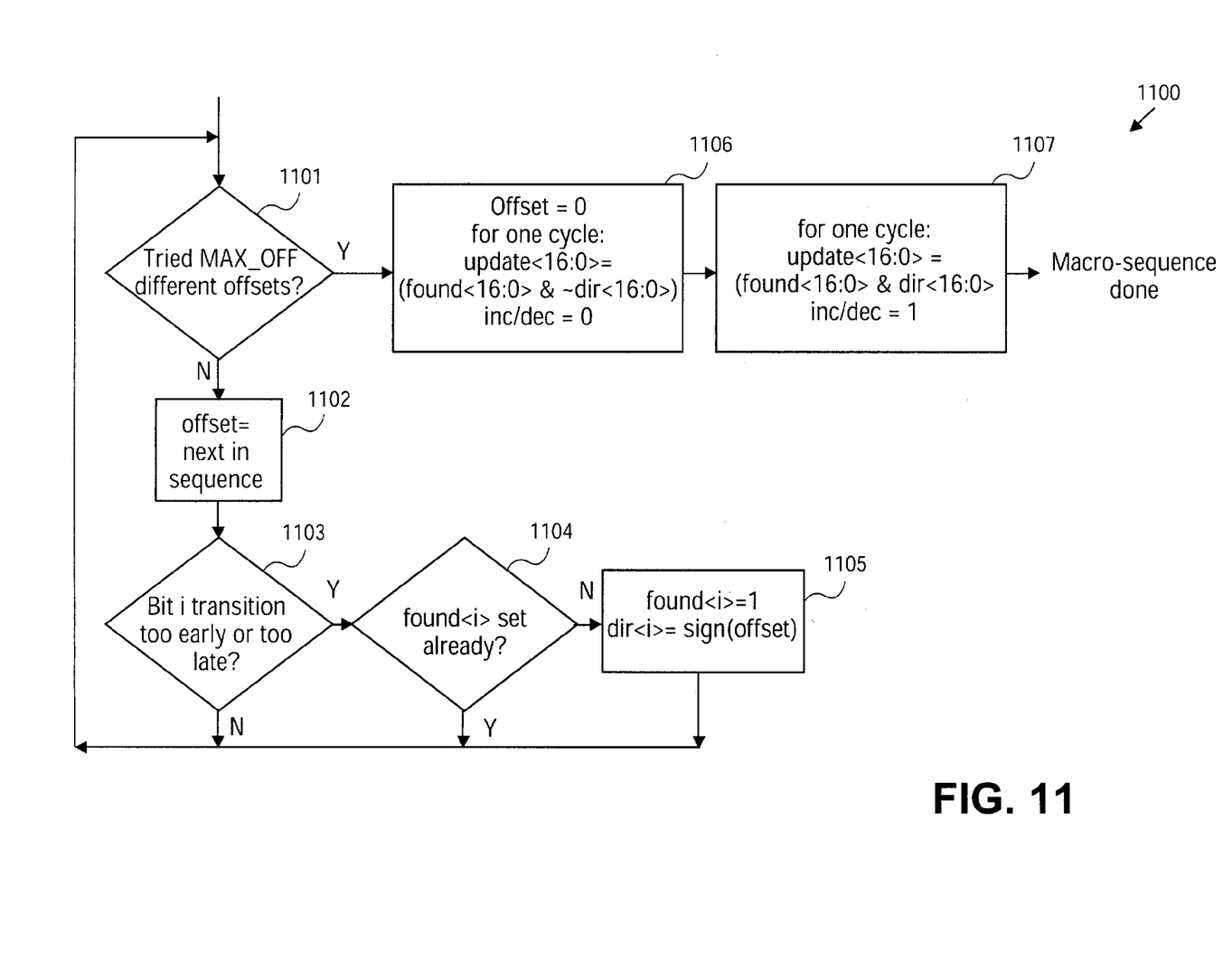
FIG. 11 shows an embodiment of a process flow for a macro sequencer to determine an appropriate fine delay for a bit in the deskew circuit of FIG. 4.
Figure 12:
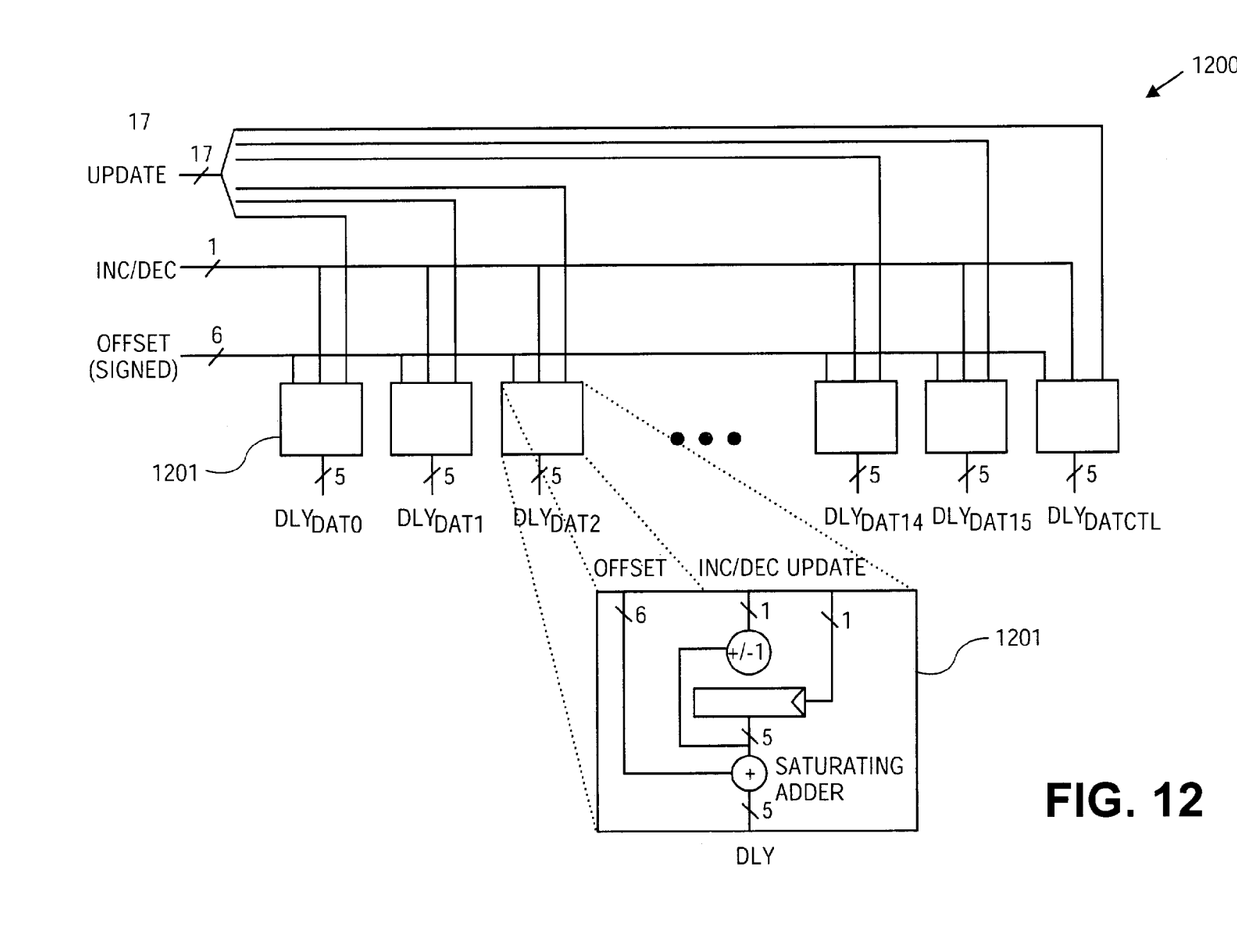
FIG. 12 shows a circuit schematic diagram to implement one embodiment of a fine delay adjustment search for the deskew circuit FIG. 4, using the macro sequencer technique shown in FIG. 11.

A variety of techniques may be implemented to perform the bit walking scheme described above to place the bit within a near center location of the bit-time frame. One embodiment to perform this operation is illustrated in FIGS. 10, 11 and 12. It is to be noted that a variety of other circuitry may be readily employed in other embodiments of the invention. Furthermore, the amount of the offset will depend on the frequency of the data transfer. At higher frequencies, edges are reached the bit-time frame may be substantially less than thirty-two offsets described below. Likewise, at slower frequencies, thirty-two offsets may not cover the complete bit-time frame. Accordingly, the actual offset value and the range of the offsets available or used depend on the particular application and the frequency of the data transfer.

FIG. 10 shows a serial delay line 1000 to introduce thirty-two delay values. As noted in FIG. 4, the variable delay element 405 for a given input line is controlled by 32 delay positions. The serial delay line 1000 is equivalent to delay element 405. Delay line 1000 has thirty-two delay stages 1001 with an output tap after the delay stages. In one embodiment, each delay stage 1001 is comprised of two inverters 1005, which are arranged in a complementary setting as noted by inverter circuit 1006 in FIG. 10. In the particular embodiment, each inverter 1005 introduces delay in the approximate range of 35–60 picoseconds or a total of about 70–120 picoseconds of delay through each stage 1001. The outputs from the delay stages 1001 are coupled to a mux 1007 and a 5-bit delay select signal DLY selects one of the thirty-two output taps. The bit output from mux 1007 corresponds to the bit output from delay element 405 of FIG. 4. As noted, a serial delay line 1000 is utilized for each of the 17 input lines. The delay element may be used with the clock signal, but the delay is fixed to the middle of the delay stages 1001.

The serial delay line introduces delays which correspond to the delay offsets described above. Therefore, by selecting the proper tap output, delay offsets may be incremented or decremented and the offset values increased when sequencing through the search for the edge. The serial delay line allows for dynamic adjustment of the offsets and the increase or decrease in the delay of the signal. The starting position of the delay tap may vary, but typically the starting position is set at the middle tap. The offset sequence to search for the edge is obtained by selecting different output taps.

The mechanism for implementing the search to find the offset value to an edge is provided by the macro sequencer unit 422 of FIG. 4. A macro sequence flow 1100 is illustrated in FIG. 11 and a delay distribution and storage circuit 1200 is illustrated in FIG. 12. The macro sequence flow 1100 performs the walking operation within the bit-time frame to determine the location of the edge. Block 1101 establishes a maximum offset for performing the walking sequence. Assuming that the starting delay point is set at 16 on the 0–31 scale, the sequence need not necessarily traverse the complete range. Hence maximum offset may be establish to limit the range of the search to find the edge.

Block 1102 sets the next offset in the sequence during the walking procedure. Some example offset sequences are −1, +1, −2, +2, . . . ; +1, −1, +2, −2, . . . ; 0, −1, +1, −2, +2, . . . ; 0, +1, −1, 2, −2, . . . . However, other sequences may be used. Block 1103 and 1104 determine if an edge is detected by a state transition for a given bit i and, if found, determining the direction to move the delay (block 1105). Block 1106 shows the condition when an early bit condition is noted, in which case the INC/DEC signal is set to 0 and update is performed to add to the stored value. Block 1107 shows the condition when a late bit condition is noted, in which case the INC/DEC signal is set to 1 and update is performed to subtract from the stored value. It is to be noted that each offset sequence uses a transition of the training sequence. Accordingly, a quite few training sequences may be needed to perform the offset sequence to center the bit placement. In some instance 256+ training sequences may be utilized.

FIG. 12 shows the update signals (one for each input line) and INC/DEC signal, all generated from blocks 1106, 1107 of FIG. 11, coupled to bit line delay select circuit 1201. The signed offset signals, generated by block 1102 of FIG. 11 are also coupled to the delay select circuit 1201. The delay select circuit 1201 utilizes a saturating adder to increment or decrement a value determined by the OFFSET value. The INC/DEC signal determines if the OFFSET value is an increment or a decrement. The stored value is corresponds to the current delay value for the location of the bit placement. The OFFSET value is added or subtracted to this value. Thus, for example, if the current delay line position for a given bit i is 16 and the OFFSET value is −2, the new value is established as 14. The DLY signal to the corresponding delay line of FIG. 10 will then select delay tap 14.

Figure 13:
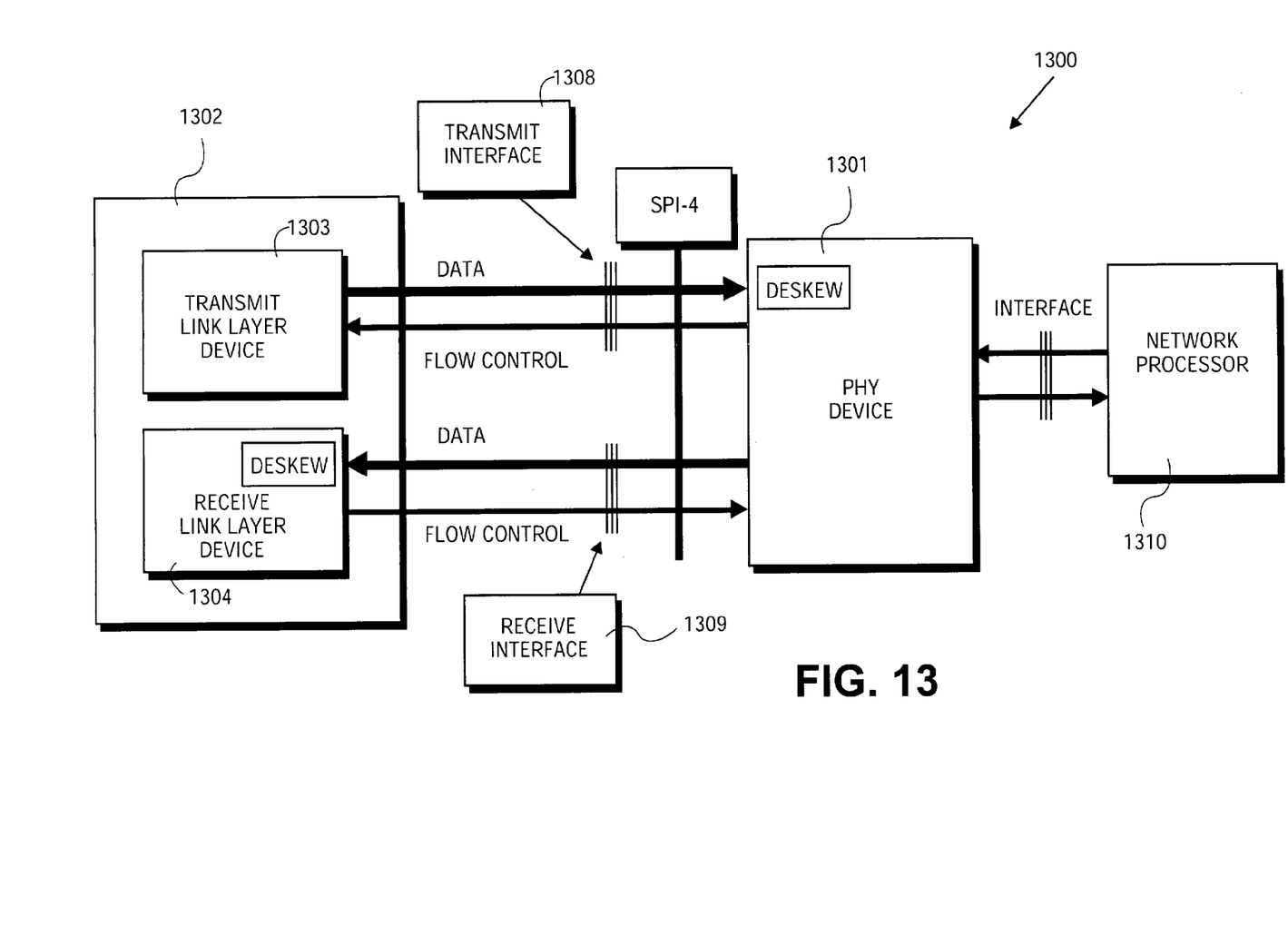
FIG. 13 shows one embodiment of a system utilizing the deskew circuit in an in-line physical device coupled between a link layer device and a network processor.

FIG. 13 shows an implementation of the above described embodiments of the invention in a system. The circuitry, whether of FIG. 1 or FIG. 4, is implemented in a physical layer (PHY) device 1301 of a communications system 1300. PHY device 1301 communicates with a link layer device 1302 utilizing the SPI-4 protocol for the interface. Link layer device 1302 is shown having a transmit unit 1303 and receive unit 1304. Data and flow control between the PHY device 1301 and the link layer units 1303, 1304 are achieved through respective interfaces 1308, 1309. Also shown in FIG. 13 is a network processor 1310, coupled to the PHY device 1301.

In operation, the transmit link layer device transmits bits [0]–[16] during one half-cycle of the clock, followed by bits [17]–[33] during another half-cycle of the clock. Thus, thirty-four bits are sent to the PHY device 1301 under the SPI-4 protocol. As noted above, RCLK signal is also transmitted to indicate the timing of the sent bits. The PHY device 1301 will then implement a deskew scheme to ensure that respective bits are correctly aligned together. Embodiments of the deskew scheme described above may be implemented in the PHY device 1301. Properly aligned bits (deskewed bits) are then sent to the network process to be processed by the processor 1310. It is to be noted that similar deskew scheme may be employed in the receive link layer device 1304 to deskew bits sent from the PHY device 1301 to link layer device 1302.

As noted in system 1300, the PHY device 1301 is placed serially between the link layer device 1302 and the network processor 1310. This example system 1300 places the PHY device in-line between the link layer device 1302 and the network processor 1310, so that the deskew may be performed within the PHY device, instead of the network processor 1310. For example, if the link layer device 1302 is a framer/deframer unit, the PHY device may handle the interface, so that the network processor need not provide the deskew operation. In one particular embodiment, PHY device 1301 handles the encrypting and decrypting of data, along with the deskew, so that those function need not be present in the network processor. However, it is to be noted that in other embodiments of the invention, the deskew circuitry may be implemented directly in the network processor 1310 or other interfaces, instead of in a separate PHY device 1301.

A number of advantages may be noted with the deskew circuit described above to align the bits into a proper data window (bit-time frame) and away from edges of the data window. Some advantages include the use of normal logic to allow the design to be implemented, which may also allow for the design to be tested much sooner than other implementations; reuse policies and practices may be applied easier; independent of technology and process used; and more scalable and flexible approach. Furthermore, from a system level, less restrictions may be placed on the high-speed system designer, since the deskew is implemented within the receiver device. This may allow for a more economical working system. Also, the deskew may be easily implemented where chip contacts (pads) may be more complex models following a different set of design rules.

Thus, an apparatus and method for deskew is described. We claim:

1. An apparatus comprising:
   a coarse delay unit to receive a bit pattern, which may be skewed in timing with a corresponding reference clocking signal, and to align sampling of bits of the bit pattern to within a same selected bit-time frame; and
   a fine delay unit to receive the bit pattern and to align sampling of bits of the bit pattern away from an edge of the selected bit-time frame, the coarse and fine delay units to perform a deskew operation by aligning bits of a bit pattern to within the same selected bit-time frame and positioned toward a center of the selected bit-time frame.

2. The apparatus of claim 1, wherein said coarse delay unit to select a bit-time frame of a latest occurring bit of the bit pattern as the selected bit-time frame and to delay sampling of bits of the bit pattern aligned to an earlier bit-time frame.

3. The apparatus of claim 1, wherein said fine delay unit to align a particular bit within the selected bit-time frame by incrementing or decrementing delay to reposition the particular bit toward the center of the selected bit-time frame.

4. The apparatus of claim 1, wherein said fine delay unit to align a particular bit within the selected bit-time frame by following a sequence of incrementing and decrementing incremental delay offsets to reposition the particular bit toward the center of the selected bit-time frame.

5. The apparatus of claim 4, wherein the sequence of delay offsets are to be increased in offset value to determine the position of the particular bit in relation to an edge of the bit-time frame and to reposition the particular bit away from the edge.

6. The apparatus of claim 4, wherein the sequence of delay offsets are to be increased in offset value to determine the position of the particular bit in relation to leading and trailing edges of the bit-time frame and to reposition the particular bit approximately near a center position of the bit-time frame.

7. The apparatus of claim 4, further including a macro sequencer to control the delay offset to be applied to reposition the particular bit.

8. The apparatus of claim 1, wherein the deskew operation is to be performed on a bit pattern specified by a System Packet Interface protocol.

9. The apparatus of claim 1, wherein a state transition change of a training sequence signal is to be used as the bit pattern to align the sampling of the bits for the deskew operation.

10. An apparatus comprising:
    a coarse delay unit to receive a bit pattern, which may be skewed in timing with a corresponding reference clocking signal, and to align sampling of bits of the bit pattern to within a same selected bit-time frame by selecting a bit-time frame of a latest occurring bit of the bit pattern as the selected bit-time frame and said coarse delay unit to delay sampling of bits of the bit pattern aligned to any earlier bit-time frame until occurrence of the selected bit-time frame; and
    a fine delay unit to receive the bit pattern and to align sampling of bits of the bit pattern away from an edge of the selected bit-time frame by introducing more or less delay offset to each individual bit to individually reposition each bit away from an edge and toward a center of the bit-time frame, the coarse and fine delay units to perform a deskew operation by aligning bits of a bit pattern to within the same selected bit-time frame and each bit sampling time moved toward a center of the selected bit-time frame.

11. The apparatus of claim 10, wherein the deskew operation to use a bit state transition of a reference bit pattern to identify bit skew and the bit state transitions are then used to align the bits to a deskewed sampling point.

12. The apparatus of claim 11, wherein the reference bit pattern is a training sequence signal of a data packet transfer protocol.

13. The apparatus of claim 11, wherein the reference bit pattern is a training sequence signal of a System Packet Interface protocol.

14. The apparatus of claim 11, wherein said fine delay unit to align a particular bit within the selected bit-time frame by following a sequence of incrementing and decrementing delay offsets to reposition the particular bit toward the center of the selected bit-time frame.

15. The apparatus of claim 14, wherein the sequence of delay offsets are to be increased in offset value to determine the position of the particular bit in relation to an edge of the bit-time frame and to reposition the particular bit away from the edge and toward the center.

16. The apparatus of claim 14, wherein the sequence of delay offsets for the particular bit are to be obtained by using a serial delay line and selecting an appropriate delay tap.

17. The apparatus of claim 16, wherein the sequence of delay offsets are to be determined by stage delays of the serial delay line.

18. The apparatus of claim 17 wherein a single stage delay for the delay line is in the approximate range of 70–120 picoseconds.

19. The apparatus of claim 14 further including a macro sequencer to control the value of the delay offset to be applied to reposition the particular bit.

20. A deskew method comprising:
    receiving an input bit pattern which may be skewed in timing to a corresponding reference clocking signal;
    applying a coarse delay adjustment to skewed bits of the pattern to place the bits of a pattern in a same selected bit-time frame to sample the bits of the pattern in the same selected bit-time frame; and
    applying a fine delay adjustment individually to bits of the pattern to position the bits of the pattern toward a center position of the selected bit-time frame to align the bits to a sampling position away from an edge of the bit-time frame.

21. The deskew method of claim 20 further including detecting bit state transitions of a training sequence signal and using the bit state transitions to apply the coarse and fine delay adjustments to align the bits into a proper bit-time frame and away from edges of the bit-time frame.

22. The deskew method of claim 21, wherein said applying the coarse delay adjustment places the bits into the bit-time frame of a latest transitioning bit of the bit pattern.

23. The deskew method of claim 22, wherein said applying the fine delay adjustment applies a sequence of incremental delay offsets to identify an edge of the bit-time frame.

24. The deskew method of claim 23, wherein said detecting and using bit state transitions of a training sequence detects and uses a System Packet Interface protocol training sequence signal.

25. A system comprising:
a link layer device to transmit data;
a deskew device to deskew data received from said link layer device, said deskew device including:
(a) a coarse delay unit to receive a bit pattern, which may be skewed in timing with a corresponding reference clocking signal, and to align sampling of bits of the bit pattern to within a same selected bit-time frame by selecting a bit-time frame of a latest occurring bit of the bit pattern as the selected bit-time frame and said coarse delay unit to delay sampling of bits of the bit pattern aligned to any earlier bit-time frame until occurrence of the selected bit-time frame;
(b) a fine delay unit to receive the bit pattern and to align sampling of bits of the bit pattern away from an edge of the selected bit-time frame by introducing more or less delay offset to each individual bit to individually reposition each bit away from an edge and toward a center of the bit-time frame, the coarse and fine delay units to perform a deskew operation by aligning bits of a bit pattern to within the same selected bit-time frame and each bit sampling time moved toward a center of the selected bit-time frame; and
a processor coupled to receive deskew data from said deskew device.

26. The system of claim 25, wherein the deskew operation includes using a bit state transition of a reference bit pattern to identify bit skew, the reference bit pattern is a training sequence signal of a data packet transfer protocol.

27. The system of claim 26, wherein the bit state transitions are used to align the bits to a deskewed sampling point.

28. The system of claim 25, wherein the deskew operation includes using a bit state transition of a reference bit pattern to identify bit skew, the reference bit pattern is a training sequence signal of a System Packet Interface protocol.

29. The system of claim 28 wherein the bit state transitions are used to align the bits to a deskewed sampling point.

30. The system of claim 25, wherein said fine delay unit to align a particular bit within the selected bit-time frame by following a sequence of incrementing and decrementing delay offsets to reposition the particular bit toward the center of the selected bit-time frame.

31. The system of claim 30 wherein the sequence of delay offsets are to be increased in offset value to determine the position of the particular bit in relation to an edge of the bit-time frame and to reposition the particular bit away from the edge and toward the center.

32. The system of claim 31 wherein said deskew device further including a macro sequencer to control the value of the delay offset to be applied to reposition the particular bit.

* * * * *